(12) United States Patent
Chang et al.

(10) Patent No.: US 7,607,067 B2
(45) Date of Patent: Oct. 20, 2009

(54) METHOD AND APPARATUS FOR ACCESSING MEMORY

(75) Inventors: Hsi-Chia Chang, Chi-Lung (TW); Chin-Huo Chu, Kao-Hsiung Hsien (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 1099 days.

(21) Appl. No.: 10/904,300

(22) Filed: Nov. 3, 2004

(65) Prior Publication Data

US 2005/0177781 A1    Aug. 11, 2005

(30) Foreign Application Priority Data

Feb. 11, 2004    (TW) .............................. 93103238 A

(51) Int. Cl.
*G11C 29/52* (2006.01)
*H03M 13/15* (2006.01)

(52) U.S. Cl. ...................................... 714/763; 714/784

(58) Field of Classification Search ................. 714/763, 714/784; *H03M 13/15; G11C 29/52*
See application file for complete search history.

(56) References Cited

U.S. PATENT DOCUMENTS 6,292,921 B1 * 9/2001 Daoudi et al. ................ 714/784
2003/0067975 A1 * 4/2003 Yamakura et al. ............ 375/233

* cited by examiner

*Primary Examiner*—Scott T Baderman
*Assistant Examiner*—Sam Rizk
(74) *Attorney, Agent, or Firm*—Winston Hsu

(57) ABSTRACT

A two-dimensional array is stored in a first storage memory. A data accessing direction of the first storage memory is in a row direction. A method for reading data in the two-dimensional array in a column direction contains reading a plurality of data sets in the array from the first storage memory; performing a calculating operation on a first data set of the plurality of data sets; storing remaining data sets of the plurality of data sets into a second storage memory; and sequentially reading and applying the calculating operation on the remaining data sets stored in the second storage memory.

18 Claims, 4 Drawing Sheets

| Width of the data set(s) | 1 word | 2 words | 3 words |
|---|---|---|---|
| Number of row changes (after all the data sets in an ECC block have been read in a column direction) | $\left\lceil \frac{182}{2} \right\rceil \times 74 = 6734$ | $\left\lceil \frac{182}{4} \right\rceil \times 74 = 3404$ | $\left\lceil \frac{182}{6} \right\rceil \times 74 = 2294$ |
| Number of cycles of row changes (after all the data sets in an ECC block have been read in a column direction) | $6734 \times 6 = 40404$ | $3404 \times 6 = 20424$ | $2294 \times 6 = 13764$ |
| Number of cycles of row changes (1xDVD system) | $40404 \times 42 = 1.697M$ | $20424 \times 42 = 0.858M$ | $13764 \times 42 = 0.578M$ |
| Number of cycles of row changes (16xDVD system) | $1.697M \times 16 = 27.15M$ | $0.858M \times 16 = 13.73M$ | $0.578M \times 16 = 9.25M$ |

Fig. 4

METHOD AND APPARATUS FOR ACCESSING MEMORY

BACKGROUND

The present invention relates to random access memory (RAM), and more specifically, to a method for reading data forming a two-dimensional array that is stored in a column direction of a RAM, wherein the RAM has a data accessing direction in a row direction.

A typical method of decoding a product code stored in a dynamic random access memory (DRAM) involves sequentially reading a particular data set from of a plurality of data sets stored in the DRAM to compute a corresponding row syndrome or column syndromes of the particular data set. The data corresponding to the particular data set is read from a range of sequential addresses of the DRAM, and a single pass through the range of addresses is made during the read operation. In this way, a row syndrome or column syndromes corresponding to the particular data set can be computed. However, it should be noted that although data is stored in the DRAM in a row direction, the product code is a two-dimensional array having data sets stored in both row and column directions. Therefore, before computing column syndromes that require data of particular columns of the product code stored in the DRAM, it is necessary to read corresponding data sets from the two-dimensional array in a column direction. An example implementation using a DVD system according to a related art is described in the following for illustration.

Please refer to FIG. 1. FIG. 1 is a diagram of a typical error correction code block (ECC block), which is stored in a DRAM of the DVD system. Data sets stored in a DVD disc are encoded using Reed-Solomon product codes (RS-PC codes), and the encoded data sets are read and stored in the DRAM. As shown in FIG. 1, each ECC block is composed of 208 rows of (182, 172) RS codes and 182 columns of (208, 192) RS codes. One row of a (182, 172) RS code occupies 182 bytes, and one column of an (208, 192) RS code occupies 208 bytes. However, because each row of the DRAM has a capacity of 512 bytes, when the ECC block shown in FIG. 1 is stored in the DRAM, multiple rows of the ECC block are stored in each row of the DRAM. Furthermore, due to the difference in row sizes between the ECC block and the DRAM, the columns of the ECC block shown in FIG. 1 do not line up when stored in the DRAM.

Please refer to FIG. 2. FIG. 2 is a flowchart describing operations of decoding a product code from an ECC block being stored in a DRAM. The product code is computed by firstly reading a data set from the DRAM. The data corresponding to the data set is read from a range of sequential addresses of the DRAM, and a single pass through the range of addresses is made during the read operation. Then, corresponding column syndromes are computed according to the related art. More specifically, the flowchart shown in FIG. 2 contains the following steps:

Step 100: Start a product code decoding operation.

Step 102: Read a data set of the ECC block from the DRAM.

Step 104: Compute column syndromes corresponding to the data set.

Step 106: Decode the product code according to the computed column syndromes for the data set.

Step 108: End.

Using the above method, when reading a data set being stored in a column direction of the EEC block in a single read operation, the entire ECC block will need to be read. For example, as shown in FIG. 1, one data set in a column direction contains two columns of (208, 192) RS codes. That is, bytes $B_{0,0}$, $B_{1,0}$, $B_{2,0}$, ... $B_{207,0}$ form a first column of (208, 192) RS code, and bytes $B_{0,1}$, $B_{1,1}$, $B_{2,1}$, ... $B_{207,1}$ form a second column of (208, 192) RS code. In the ECC block, from the first row to the last row, two bytes in each row are sequentially read. That is, bytes $[B_{0,0}, B_{0,1}]$, $[B_{1,0}, B_{1,1}]$, $[B_{2,0}, B_{2,1}]$ ... $[B_{207,0}, B_{207,1}]$ are sequentially read and are stored in a static random access memory (SRAM). In this way, the first and second columns of (208, 192) RS codes are completely read. In this example, the width of the data set is one word (1 word=2 bytes). Therefore, each time a data set in the ECC block is read from the DRAM, the number of row changes experienced in the DRAM is 74. ( $$208 \Big/ \left(\frac{512}{182}\right) = 74,$$

wherein 512 is the number of bytes in a row of the DRAM, 182 is the number of bytes in a row of an ECC block, and 208 is the number of rows of an ECC block.) Therefore, to read all the data sets in the ECC block stored in the DRAM, 6734 row changes of the DRAM are required. ( $$\left\lceil \frac{182}{2} \right\rceil \times 74 = 6734,$$

wherein 182 is the number of RS columns, 2 is the number of RS columns in a data set, and 74 is the number of row changes experienced in the DRAM for each data set.) In the above-mentioned step 104, the number of the column syndromes is two, and the two column syndromes respectively correspond to two (208, 192) RS codes.

SUMMARY

It is therefore one objective of the claimed invention to provide a method for reading data that increases the efficiency of memory access. A DVD system is used as an exemplary embodiment according to the claimed invention.

According to the claimed invention, a method is disclosed for reading data in a two-dimensional array in a column direction. The two-dimensional array is stored in a first storage memory, and a data accessing direction of the first storage memory is in a row direction. The method comprises the following steps: reading a plurality of data sets in the array from the first storage memory; performing a calculating operation on a first data set of the plurality of data sets; storing remaining data sets of the plurality of data sets into a second storage memory; and sequentially reading and applying the calculating operation on the remaining data sets stored in the second storage memory.

It is an advantage of the claimed invention that the efficiency of memory access is increased by reading a plurality of data sets in a column direction to minimize an overall number of clock cycles requiring row changes in the first storage memory.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 4 is a table summarizing relationships between the number of words read in a column direction, the number of row changes, and the number of needed clock cycles when decoding a product code according to the flowchart of FIG. 3.

DETAILED DESCRIPTION

Figure 1:
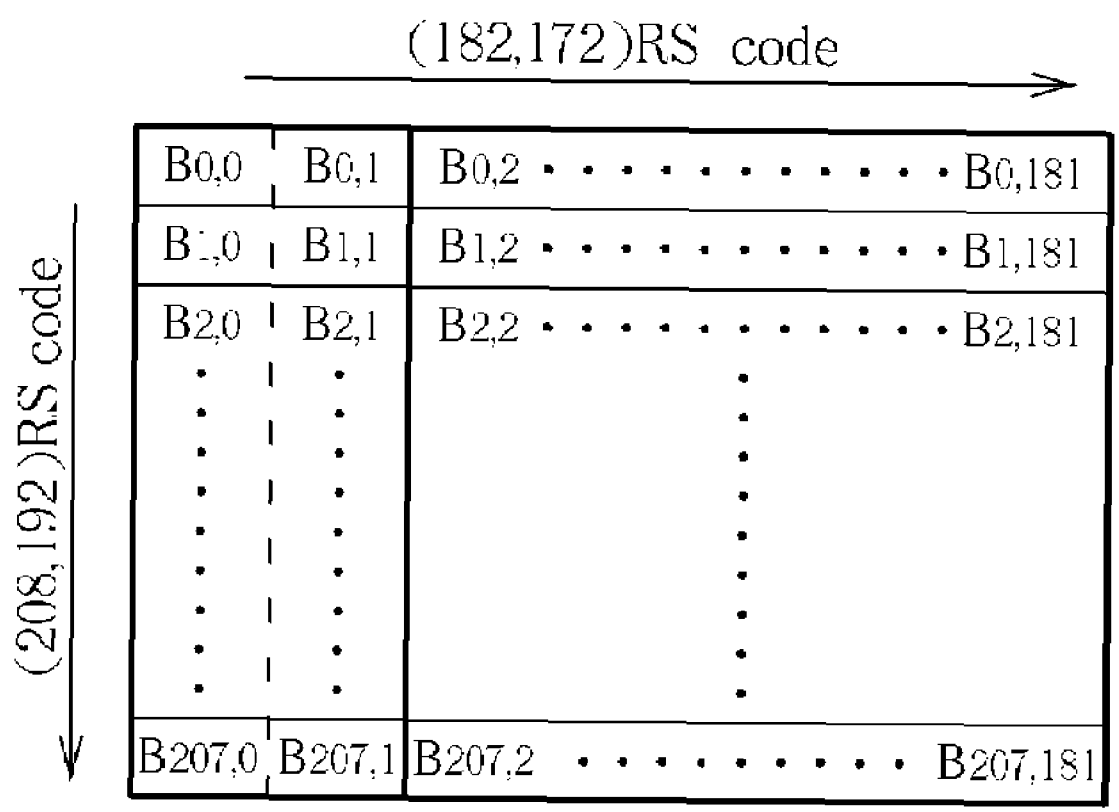
FIG. 1 is a diagram of a typical error correction code block (ECC block).
Figure 2:
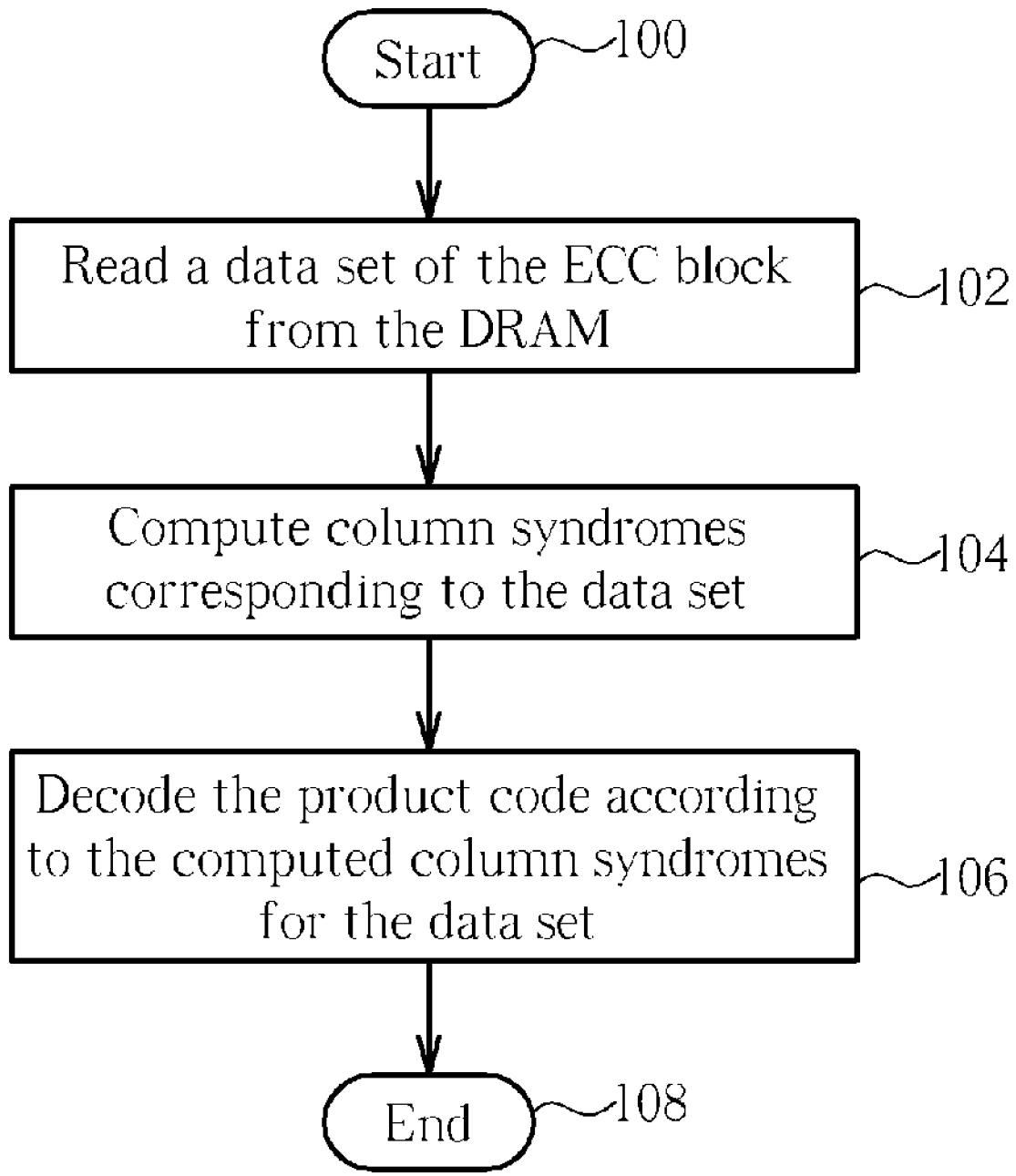
FIG. 2 is a flowchart describing operations of decoding a product code from the ECC block of FIG. 1 when the ECC block is stored in a DRAM.
Figure 3:
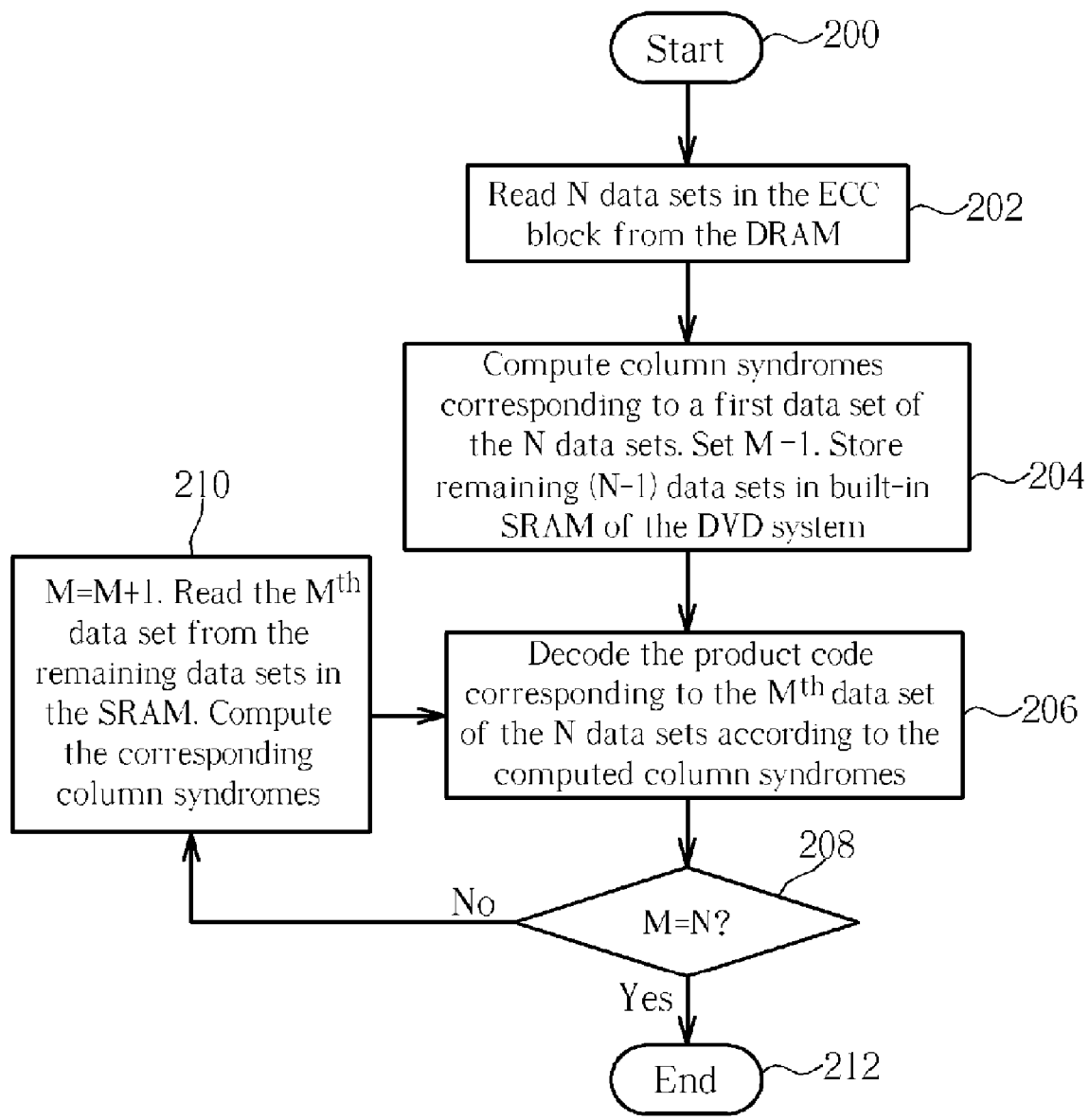
FIG. 3 is a flowchart describing operations of decoding a product code stored in a DRAM by reading N data sets in a single read pass and then computing the corresponding column syndromes according to an exemplary embodiment of the present invention.

FIG. 3 shows a flowchart describing operations of decoding a product code stored in a DRAM according to an exemplary embodiment of the present invention. The disclosed method for reading data to compute corresponding column syndromes increases the efficiency of memory access by reading a plurality of data sets in a column direction to reduce an overall number of row changes in the DRAM. In the following description of this embodiment of the present invention, a DVD system is used for illustration. Additionally, as will be understood by a person of ordinary skill in the art, data stored on a DVD disc is encoded utilizing the structure of ECC blocks as shown in FIG. 1.

Please refer to FIG. 3. FIG. 3 shows a flowchart describing operations of decoding a product code stored in a DRAM, such as a synchronous dynamic random access memory (SDRAM), by reading N data sets (where N≧1) in a single read pass of DRAM addresses, and then computing the corresponding column syndromes according to an exemplary embodiment of the present invention. As shown in FIG. 3, the flowchart contains the following steps:

Step 200: Start a product code decoding operation.

Step 202: Read N data sets in the ECC block from the DRAM (where N≧1).

Step 204: Compute column syndromes corresponding to a first data set of the N data sets. Set a variable M to have a value of 1, where the variable M represents that the $M^{th}$ data set of the N data sets is being processed. The remaining data sets ((N−1) data sets) are sequentially stored in a built-in SRAM of the DVD system.

Step 206: Decode the product code corresponding to the $M^{th}$ data set of the N data sets according to the computed column syndromes.

Step 208: Determine if M=N. That is, determine if the $M^{th}$ data set is the last of the N data sets. If yes, proceed to step 212; otherwise, proceed to step 210.

Step 210: Increment the variable M by 1, and then read the new $M^{th}$ data set from the remaining data sets in the SRAM. Compute column syndromes corresponding to the new $M^{th}$ data set and then return to step 206.

Step 212: When all data sets have been processed, the product decoding operation is ended.

As shown above, by reading N data sets in a column direction in a single read pass of DRAM addresses, the ECC block is completely processed. As shown in FIG. 1, one data set in a column direction contains two columns of (208, 192) RS codes. That is, bytes $B_{0,0}, B_{1,0}, B_{2,0}, \ldots B_{207,0}$ form a first column of (208, 192) RS code, and bytes $B_{0,1}, B_{1,1}, B_{2,1}, \ldots B_{207,1}$ form a second column of (208, 192) RS code. When reading the ECC block shown in FIG. 1, from the first row to the last row, 2×N bytes in each row are read sequentially. More specifically, bytes $[B_{0,0}, B_{0,1}, B_{0,2}, B_{0,3}, \ldots B_{0,2\times(N-1)}, B_{0,2\times N-1}]$, $[B_{1,0}, B_{1,1}, B_{1,2}, B_{1,3}, \ldots B_{1, 2\times(N-1)}, B_{1,2\times N-1}]$, $[B_{207,0}, B_{207,1}, B_{207,2}, B_{207,3}, \ldots B_{207, 2\times(N-1)}, B_{207,2\times N-1}]$ are sequentially read. Therefore, all 2×N columns of (208, 192) RS codes are completely read. As the width of the N data sets is N words (1 word=2 bytes), each time the N data sets in the ECC block stored in the DRAM are read, the number of row changes experienced by the DRAM is 74.

$$\left(208 / \left(\frac{512}{182}\right) = 74.\right)$$

After finishing processing all the data sets in the ECC block stored in the DRAM, the number of row changes experienced by the DRAM is $$\left\lceil \frac{182}{(2\times N)} \right\rceil \times 74.$$

Therefore, when compared with the related art, if N=2, after all data sets in the ECC block in the DRAM are read, the number of total row changes experienced when reading an entire ECC block is reduced from 6734 to 3404.

$$\left(\left\lceil \frac{182}{4} \right\rceil \times 74 = 3404\right)$$

In this way, increasing the number of words read in a column direction reduces the total number of row changes.

Please refer to FIG. 4. FIG. 4 is a table summarizing relationships between the number of words read in a column direction, the number of row changes, and the number of required clock cycles when decoding a product code according to the flowchart of FIG. 3. In FIG. 4, the number of required clock cycles for changing a row in the DRAM is specified as 6. The reason behind this specification is that, generally speaking, the clock cycles for row changes in a DRAM include one cycle for pre-charging, $2\times N_1$ cycles for checking the pre-charging, one cycle for activation, and $2\times N_2$ cycles for checking the row/column addresses. Therefore, even in the case that $N_1=N_2=1$, it is still necessary to use at least 6 clock cycles to complete the row change in the DRAM.

As shown in FIG. 4, when the number of words to be read in a column direction is increased from 1 to 3, as in the case of a 16×DVD system, the clock cycles used for row changes is reduced from 27.15M cycles/sec to 9.25M cycles/sec. That is, by reading a plurality of data sets in a column direction, the clock cycles used for row changes in the DRAM are reduced.

Please note that the SRAM used in step 204 for storing the remaining data sets is already included in DVD systems. Therefore, when decoding the Reed-Solomon product code conforming to the DVD specification, the number of clock cycles used for row changes in the DRAM can be substantially reduced by increasing the number of words being read in a column direction without additional hardware (SRAM).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reading data in a two-dimensional array in a column direction, the two-dimensional array being stored in a first storage memory, a data accessing direction of the first storage memory being in a row direction, and the method comprising the following steps:

reading a plurality of data sets in the column direction of the two-dimensional array from the first storage memory;

performing a calculating operation on a first data set of the plurality of data sets;

storing remaining data sets of the plurality of data sets into a second storage memory; and sequentially reading and applying the calculating operation on the remaining data sets stored in the second storage memory.

2. The method of claim 1, wherein the data sets are encoded utilizing Reed-Solomon product codes (RS-PC codes).

3. The method of claim 1, wherein the two-dimensional array is an error correction code block (ECC block); the ECC block comprising 208 rows of (182, 172) RS codes and 182 columns of (208,192) RS codes with each row of (182, 172) RS code occupying 182 bytes and each column of (208, 192) RS code occupying 208 bytes.

4. The method of claim 3, wherein two (208, 192) RS codes in a column direction form a data set in the ECC block.

5. The method of claim 1, wherein the first storage memory is a dynamic random access memory (DRAM).

6. The method of claim 1, wherein the first storage memory is a synchronous dynamic random access memory (SDRAM).

7. The method of claim 6, wherein the second storage memory is a static random access memory (SRAM).

8. The method of claim 1, wherein the second storage memory is a static random access memory (SRAM).

9. The method of claim 1, wherein the step of performing a calculating operation on a data set of the plurality of data sets further comprises computing column syndromes corresponding to the data set.

10. A method for reading data in a two-dimensional array, the method comprising the following steps:

reading a plurality of data sets in a column direction of the two-dimensional array from a first storage memory;

performing a calculating operation on a first data set of the plurality of data sets;

storing remaining data sets of the plurality of data sets into a second storage memory; and sequentially reading and applying the calculating operation on the remaining data sets stored in the second storage memory.

11. The method of claim 10, wherein the data sets are encoded utilizing Reed-Solomon product codes (RS-PC codes).

12. The method of claim 10, wherein the two-dimensional array is an error correction code block (ECC block); the ECC block comprising 208 rows of (182, 172) RS codes and 182 columns of (208,192) RS codes with each row of (182, 172) RS code occupying 182 bytes and each column of (208, 192) RS code occupying 208 bytes.

13. The method of claim 12, wherein two (208, 192) RS codes in a column direction form a data set in the ECC block.

14. The method of claim 10, wherein the first storage memory is a dynamic random access memory (DRAM).

15. The method of claim 10, wherein the first storage memory is a synchronous dynamic random access memory (SDRAM).

16. The method of claim 15, wherein the second storage memory is a static random access memory (SRAM).

17. The method of claim 10, wherein the second storage memory is a static random access memory (SRAM).

18. The method of claim 10, wherein the step of performing a calculating operation on a data set of the plurality of data sets further comprises computing column syndromes corresponding to the data set.

* * * * *